United States Patent
Uchida et al.

(10) Patent No.: US 6,762,925 B2
(45) Date of Patent: Jul. 13, 2004

(54) CERAMIC ELECTRONIC COMPONENT AND METHOD FOR MAKING THE SAME

(75) Inventors: Katsuyuki Uchida, Hikone (JP);
Toshio Kawabata, Yokaichi (JP);
Takehiko Otsuki, Omihachiman (JP);
Masami Sugitani, Omihachiman (JP);
Motoi Nishii, Omihachiman (JP);
Yukio Sakamoto, Moriyama (JP);
Kaoru Tachibana, Shiga-ken (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/402,997

(22) Filed: Apr. 1, 2003

(65) Prior Publication Data

US 2003/0214793 A1 Nov. 20, 2003

(30) Foreign Application Priority Data

Apr. 1, 2002 (JP) .................... 2002-098562
Feb. 14, 2003 (JP) .................... 2003-037224

(51) Int. Cl.$^7$ ............................... H01G 4/06
(52) U.S. Cl. .............. 361/321.1; 361/311; 336/40; 29/25.41
(58) Field of Search ............... 361/311, 312, 361/313, 321.4, 321.5, 321.1; 336/40, 70, 84 M (56) References Cited

U.S. PATENT DOCUMENTS 6,589,446 B1 * 7/2003 Nakamura et al. ....... 252/363.5

FOREIGN PATENT DOCUMENTS

| JP | 55-52300 | 4/1980 |
|----|----------|--------|
| JP | 61-281088 | 12/1986 |
| JP | 62-26886 | 2/1987 |
| JP | 63-209150 | 8/1988 |
| JP | 07-014717 | 1/1995 |
| JP | 07-101740 | 4/1995 |
| JP | 07-240334 | 9/1995 |
| JP | 10-092644 | 4/1998 |
| JP | 11-067575 | 3/1999 |

* cited by examiner

Primary Examiner—Anthony Dinkins
(74) Attorney, Agent, or Firm—Dickstein, Shapiro, Morin & Oshinsky, LLP.

(57) ABSTRACT

A ceramic electronic component includes a ceramic sintered compact containing about 35 to 80 volume percent pores and an electrode provided inside the ceramic sintered compact. The pores are filled with resin or glass. This ceramic electronic component is formed by forming a green compact which includes an electrode therein with a ceramic compound having a ceramic raw material, a binder and a spherical or granular combustible material having adhesiveness to the binder. The green compact is fired to form the ceramic sintered compact including the electrode and containing about 35 to 80 volume percent pores. The pores of the ceramic sintered compact are filled with resin or glass.

20 Claims, 6 Drawing Sheets

CERAMIC ELECTRONIC COMPONENT AND METHOD FOR MAKING THE SAME

BACKGROUND OF THE INVENTION

1. Field of the Invention

The present invention relates to ceramic electronic components and methods for making the same. In particular, the present invention relates to a ceramic electronic component having superior impedance characteristics in high-frequency bands such as the gigahertz band and exhibiting high impedance over a broad frequency range, and relates to a method for making the same.

2. Description of the Related Art

With use of electronic devices in high-frequency ranges in recent years, inductors, LC composite electronic components, LR composite electronic components, and LCR composite electronic components that can be used in the gigahertz band are required.

Unfortunately, stray capacitance generated parallel to a coil in inductors for high-frequency bands significantly affects the impedance of the coil. In particular, a minute stray capacitance in the range of 1/100 pF to 1/10 pF significantly affects the impedance in the gigahertz band. If the stray capacitance is reduced while required characteristics are maintained, the dielectric constant $\in$ of the ferrite used as a magnetic material should be reduced. However, it is virtually impossible for the dielectric constant $\in$ of the ferrite to be reduced to, for example, 13 to 14, because of the structural factor of the ferrite.

A possible way to reduce the dielectric constant $\in$ is a composite magnetic material that is prepared by compounding of a material having a low dielectric constant, such as resin or glass, with a magnetic material. In such composite magnetic material, the magnetic particles are covered by the resin or glass nonmagnetic material. Since the magnetic path is segmented, the permeability of the composite magnetic material is extremely low.

A porous ferrite sintered compact having a porosity of 20% to 70% is known as a ferrite material having a low dielectric constant which is used in an electromagnetic wave absorber, as disclosed in Japanese Unexamined Patent Application Publication No. 55-526300. Since this ferrite sintered compact containing a high rate of pores has a low dielectric constant and a continuous magnetic path, it does not cause a discontinuous and large variation in electromagnetic characteristics. In the porous ferrite sintered compact, individual ferrite particles are magnetically coupled with each other even at a high porosity; hence, this ferrite sintered compact exhibits a small dependence of complex permeability on frequency dispersion characteristics. However, a high porosity of this porous ferrite sintered compact causes decreased mechanical strength, and more particularly, low flexural strength, of a resulting electronic component.

A porous ceramic electronic component is disclosed in Japanese Unexamined Patent Application Publication No. 11-67575. This ceramic electronic component is composed of ceramic containing 3% to 30% by volume of pores with a diameter of 1 µm to 3 µm and an internal electrode provided in the ceramic. Such a porous ceramic electronic component has a low dielectric constant and thus exhibits improved impedance characteristics.

In this technology, the upper limit of the pore content is 30% by volume because a pore content exceeding the upper limit decreases the flexural strength of the ceramic. Thus, the relative dielectric constant cannot be reduced to a level that is required for current ceramic electronic components having superior characteristics. Furthermore, the pores in the ceramic of this ceramic electronic component easily absorb moisture. A high water absorbance deteriorates reliability of the component.

SUMMARY OF THE INVENTION

An object of the present invention is to provide a ceramic electronic component including a ceramic sintered compact having a low dielectric constant and high mechanical strength and a method for making the ceramic electronic component.

According to a first aspect of the present invention, a ceramic electronic component comprises a ceramic sintered compact containing about 35 to 80 volume percent pores; and an electrode provided inside the ceramic sintered compact, wherein the pores are fully or partly filled with resin or glass.

The ceramic electronic component contains about 35 to 80 volume percent pores that are fully or partly filled with the resin or glass. Furthermore, the ceramic phase of the ceramic sintered compact is continuous in the present invention. Accordingly, the ceramic electronic component exhibits a decreased dielectric constant without deterioration of electrical characteristics and mechanical strength of the ceramic sintered compact.

The present invention is based on the recognition by the inventors that a small amount of resin or glass packed in the pores significantly improves the tensile stress of ceramic materials have high compression stress but low tensile stress, such as ferrite. Thus, a ceramic electronic component having a porosity of about 80 volume percent according to the present invention favorably compares with a conventional component having a porosity of 30 volume percent in that the dielectric constant is drastically decreased to about 6 or less without deterioration of the mechanical strength such as flexural strength and electrical characteristics.

The ceramic electronic component of the present invention has pores in the ceramic sintered compact. If the ceramic sintered compact is magnetic, the permeability of the porous magnetic sintered compact decreases to some extent compared with the corresponding solid compact. However, the magnetic ceramic sintered compact has a continuous magnetic path. Thus, the permeability of the magnetic material is maintained in the sintered compact. This indicates that the cross-point frequency at which $\mu'=\mu''$ does not substantially change.

Preferably, the average pore diameter is in the range of about 5 µm to 20 µm. A diameter of less than about 5 µm causes the formation of closed pores that cannot be impregnated with glass or resin. A diameter exceeding about 20 µm causes a noticeable reduction in strength of the sintered compact. More preferably, the average pore diameter is in the range of about 5 µm to 10 µm.

The porosity (volume rate) of the pores must be at least about 35 volume percent in order that the ceramic sintered compact has a sufficiently low dielectric constant with satisfactory mechanical strength. However, a porosity exceeding about 80 volume percent causes a noticeable decrease in mechanical strength that inhibits subsequent processing such as resin or glass impregnation. Thus, the upper limit of the porosity is about 80 volume percent in the present invention. Preferably, the porosity is in the range of about 40 volume percent to about 50 volume percent. Since the resin or glass packed in the pores reinforces the ceramic sintered compact, the ceramic sintered compact can be processed within the pore diameter range of about 5 μm to 20 μm and the porosity of about 80 volume percent or less.

Preferably, the ceramic sintered compact is formed by firing a green compact comprising a ceramic raw material, a binder, and a spherical or granular combustible material having adhesiveness to the binder. If a magnetic sintered compact is formed in this process, the porous ceramic sintered compact has a continuous magnetic path. Thus, the ceramic electronic component has desired magnetic characteristics, reduced stray capacitance, and required electrical and mechanical characteristics.

Preferably, the resin or glass in the pores contains internal pores. The internal pores contribute to a further decrease in dielectric constant of the ceramic sintered compact.

Preferably, the ceramic sintered compact is a magnetic ceramic sintered compact. The magnetic ceramic material can be used for production of inductors. For example, an inductor as a ceramic electronic component comprising the magnetic ceramic sintered compact has desired magnetic characteristics, reduced stray capacitance due to a decreased dielectric constant, and required electrical and mechanical characteristics.

In the present invention, the ceramic electronic component may an inductor, an LC composite electronic component comprising an inductor segment and a capacitor segment, an LR composite electronic component comprising an inductor segment and a resistor segment, and an LCR composite electronic component comprising an inductor segment, a capacitor segment, and a resistor segment, and the like. These ceramic electronic components exhibit high mechanical strength, reduced stray capacitance, and other desired properties.

The ceramic electronic component of the present invention may have a multilayer structure including an electrode layer provided between ceramic layers. That is, the present invention is preferably applicable to a multilayer or monolithic ceramic electronic component since the ceramic sintered compact of the present invention has high reliability, i.e., high mechanical strength such as flexural strength, and a low dielectric constant.

Preferably, at least one surface of the ceramic sintered compact is also covered with the resin or glass. More preferably, all the surfaces are covered with the resin or glass. The surface resin or glass layer or layers reinforce the ceramic sintered compact.

According to another aspect of the present invention, a method for making a ceramic electronic component including a ceramic sintered compact and an electrode inside the ceramic sintered compact, comprises the steps of:

(a) forming a green compact including an electrode therein with a ceramic compound comprising a ceramic raw material, a binder, and a spherical or granular combustible material having adhesiveness to the binder;

(b) firing the green compact to form the ceramic sintered compact including the electrode and containing about 35 to 80 volume percent pores; and (c) impregnating the pores of the ceramic sintered compact with resin or glass.

The ceramic electronic component produced by this method contains about 35 to 80 volume percent pores that are filled with the resin or glass. Furthermore, the ceramic phase of the ceramic sintered compact is continuous in the present invention. Accordingly, the ceramic electronic component exhibits a decreased dielectric constant without deterioration of electrical characteristics and mechanical strength of the ceramic sintered compact. The resin or glass packed in the pores reinforces the ceramic sintered compact. Accordingly, this method allows production of ceramic electronic components having satisfactory mechanical, electrical and magnetic characteristics.

The combustible material may be spherical or granular including powder. Preferably, the combustible material is spherical from the viewpoint of dispersion uniformity. Preferably, the combustible material has an average particle size in the range of about 5 μm to 20 μm in order to form pores with a diameter in the range of about 5 μm to 20 μm. The combustible material is added to the ceramic compound in an amount of about 35 volume percent to 80 volume percent and preferably about 40 volume percent to 50 volume percent to form a desired porosity. Within the range, the combustible material content may be appropriately determined depending on a target porosity.

Preferably, the combustible material comprises at least one compound selected from the group consisting of crosslinked polystyrene, crosslinked polymethyl methacrylate, crosslinked polybutyl methacrylate, crosslinked polymethacrylate esters and crosslinked polyacrylate esters. These combustible materials can readily burn in the firing step and thus facilitate the formation of a ceramic sintered compact with a desired porosity. For a significantly high porosity, the combustible material content should be generally increased whereas the binder content should be decreased. This, however, causes a decrease in mechanical strength of green products, resulting in a low product yield. Crosslinked polymer with a large surface area is preferred because it exhibits high adhesiveness to the resin binder and high shape retention. Thus, the binder content can be reduced in the present invention. Accordingly, the method facilitates production of a ceramic electronic component comprising a ceramic sintered compact with a high porosity at a high product yield.

In the method, the resin or glass may contain a solvent or a diluent. In this case, in the step (c), the pores are filled with the resin or glass, and then the solvent or diluent is evaporated to form internal pores in the resin or glass. The internal pores contribute to a further reduction in dielectric constant of the ceramic sintered compact. Examples of usable solvents or diluents are ethanol, xylene, butyl acetate and water.

Preferably, the solvent (diluent) content is in the range of about 5 to 50 parts by volume to 100 parts by volume of resin or glass. A solvent content of less than about 5 parts by volume causes an insufficient decrease in viscosity of the solution and thus precludes processing. A solvent content exceeding about 50 parts by volume results in insufficient removal of the solvent and residual solvent in the resin deteriorates properties of the resin.

In the method, the resin or glass may be partly soluble in a solvent. In this case, the pores are filled with the resin or glass in the step (c), and then the resin or glass is partly dissolved with the solvent to form internal pores in the resin or glass. Since the resin or glass packed in the pores of the ceramic sintered compact is partly removed in this step, the ceramic sintered compact has a smaller dielectric constant. In this case, the resin or glass itself need not be soluble in the solvent. For example, a component compounded in the resin may be soluble in the solvent. Alternatively, the glass may contain a soluble component so that the glass can be partly removed when the soluble component is dissolved into the solvent.

Preferably, the ceramic raw material is a magnetic ceramic raw material. For example, a magnetic ceramic material is used for production of inductors. An inductor as a ceramic electronic component comprising the magnetic ceramic sintered compact has desired magnetic characteristics, reduced stray capacitance due to a decreased dielectric constant, and required electrical and mechanical characteristics.

In the present invention, the ceramic electronic component may be an inductor, an LC composite electronic component comprising an inductor segment and a capacitor segment, an LR composite electronic component comprising an inductor segment and a resistor segment, or an LCR composite electronic component comprising an inductor segment, a capacitor segment, and a resistor segment. These ceramic electronic components exhibit high mechanical strength, reduced stray capacitance, and other desired properties.

In the step (a), the green compact may formed by providing an electrode layer on one or more of a plurality of green ceramic sheets comprising the ceramic compound, and stacking the plurality of green ceramic sheets having the electrode layer. According to this process, a monolithic ceramic electronic component having high reliability and high mechanical strength can be readily produced with high efficiency.

DESCRIPTION OF THE PREFERRED EMBODIMENTS

Figure 1:
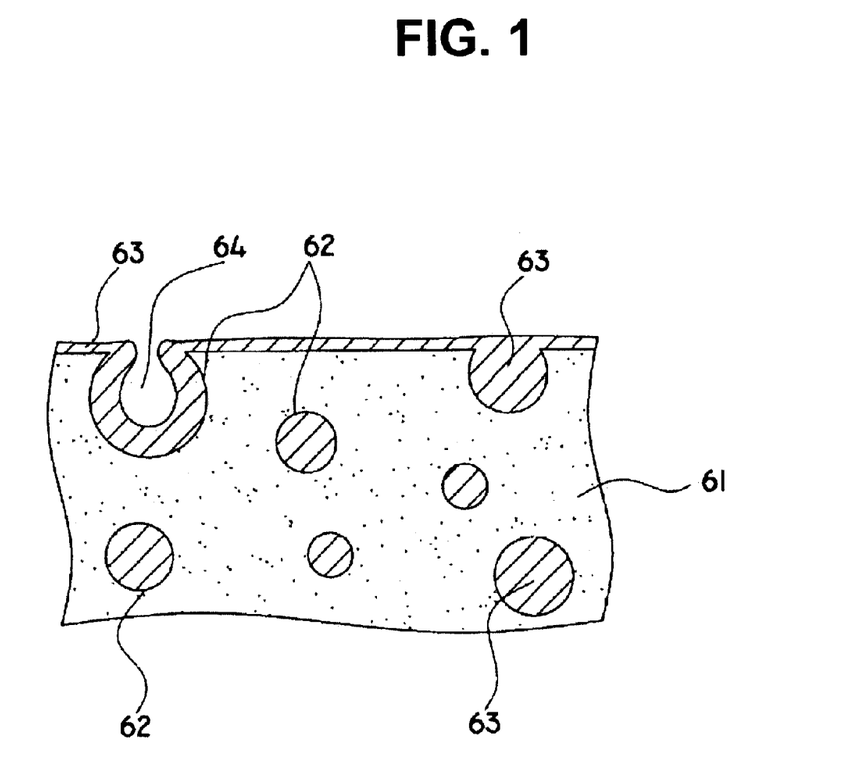
FIG. 1 is a schematic partial cross-sectional view of a ceramic sintered compact in a ceramic electronic component in accordance with the present invention.

A ceramic sintered compact of a ceramic electronic component according to the present invention will now be described with reference to FIG. 1. The ceramic sintered compact 61 of the present invention has a plurality of pores 62 that are filled with resin or glass 63. A surface of the ceramic sintered compact is also covered with the resin or glass 63.

The pores 62 have an average diameter in the range of about 5 $\mu$m to 20 $\mu$m and occupy about 35 to 80 volume percent of the ceramic sintered compact 61. The pores 62 include both open pores and closed pores.

Preferably, about 30% to 70% volume of the pores 62 is filled with the resin or glass 63 in the present invention. In other words, the pores 62 may be entirely or partially filled with the resin or glass 63. When the pores 62 are partially filled with the resin or glass 63, the resin or glass 63 in the pores 62 contains internal pores 64.

The ceramic sintered compact may be composed of any functional ceramic, such as a magnetic ceramic, a dielectric ceramic, a semiconductive ceramic and a piezoelectric ceramic.

The present invention will now be described in more detail by the following embodiments.

First Embodiment (A) Preparation of Porous Ceramic Sintered Compact

In a first embodiment, a method for making a porous ceramic sintered compact will be described.

(1) Nickel oxide, zinc oxide and copper oxide were mixed, and the mixture was calcined at 800° C. for one hour to prepare a NiZnCu ferrite material with a permeability $\mu$ of 400.

(2) The mixture was pulverized with a ball mill and was dried to prepare a ferrite material (mixed oxide powder) with an average diameter of about 2 $\mu$m.

(3) A commercially available spherical polymer was added to the ferrite material according to the recipe shown in Table 1. The mixture was compounded with a solvent, a binder and a dispersant to prepare a ceramic raw material. Using this ceramic raw material, ceramic green sheets with a thickness of 100 $\mu$m were prepared by a doctor blade method.

The combustible material (pore-forming material) is preferably a spherical polymer having a large surface area, high adhesiveness and high shape retention. The use of such a spherical polymer allows the binder content to decrease and the combustible material content to increase without a decreased yield. As a result, the porosity (pore content) is increased. In this embodiment, the spherical polymer was a spherical combustible material of crosslinked polystyrene with an average diameter of 8 $\mu$m, TECHPOLYMER made by Sekisui Plastics Co., Ltd.

(4) The resulting green ceramic sheets were stacked and compacted to form a green compact with a thickness of 2 mm. From the green compact, a ring test piece, a disk test piece and a rectangular test piece were prepared.

(5) The green compact was fired at 400° C. for 3 hours for removing the binder and then was fired at 900° C. for 2 hours to prepare a ceramic sintered compact.

In the first embodiment, the organic content (particularly the combustible material content) was varied to control the porosity. For example, a combustible material content of 50 volume percent in the ceramic raw material results in a porosity of about 50 volume percent in the ceramic sintered compact. The volume porosity of the ceramic sintered compact was calculated by the specific gravity of the ceramic sintered compact wherein the specific gravity of the pore (air) was 0 g/cm$^3$ and the observed specific gravity of the ferrite was 5.02 g/cm$^3$.

(6) The ceramic sintered compact was dipped into a Li—K liquid glass with a dielectric constant of 3.9 to impregnate the pores with the liquid glass and to form a glass film on the surface of the ceramic sintered compact, and was fired at 800° C. for melting and baking of the glass.

Table 1 shows the observed results (dielectric constant, permeability, flexural strength, and water absorption) of the fired ceramic sintered compact.

TABLE 1

| Sample | Average diameter of spherical polymer (μm) | Pore diameter (μm) | Porosity (%) | Pores filled with glass | | | Water absorbance (%) | | Flexural strength (MPa) | |
|---|---|---|---|---|---|---|---|---|---|---|
| | | | | Dielectric constant at 1 MHz | Complex permeability At 1 MHz | At 1 GHz | Before glass impregnation | After glass impregnation | Before glass impregnation | After glass impregnation |
| 1 | 8 | 7 | 0 | 14.5 | 430 | 11 | 0.20 | — | 80 | — |
| 2 | 8 | 7 | 10 | 14.0 | 320 | 7.9 | 1.89 | 0.19 | 74 | 81 |
| 3 | 8 | 7 | 30 | 11.0 | 220 | 6.6 | 3.72 | 0.12 | 59 | 82 |
| 4 | 8 | 7 | 35 | 9.9 | 175 | 5.5 | 4.39 | 0.10 | 51 | 82 |
| 5 | 8 | 7 | 40 | 9.0 | 150 | 4.8 | 5.75 | 0.08 | 46 | 82 |
| 6 | 8 | 7 | 50 | 8.1 | 119 | 3.5 | 10.0 | 0.08 | 34 | 84 |
| 7 | 8 | 7 | 60 | 7.0 | 89 | 2.9 | 16.4 | 0.07 | 19 | 84 |
| 8 | 8 | 7 | 70 | 6.3 | 59 | 2.2 | 18.9 | 0.07 | 14 | 84 |
| 9 | 8 | 7 | 80 | 5.8 | 49 | 1.8 | 19.5 | 0.07 | 10 | 84 |

The permeability was measured with the ring test piece, the dielectric constant with the disk test piece and the flexural strength with the rectangular test piece. Table 1 shows that the dielectric constant decreased with the porosity of the ceramic sintered compact. In the ceramic sintered compact not containing the glass (Sample 1), the flexural strength was low and the water absorbance was high. In contrast, the ceramic sintered compacts containing the glass exhibited a decreased dielectric constant without a decrease in flexural strength and an increase in water absorbance.

Accordingly, the flexural strength of the ceramic sintered compact having the pores filled with the glass was equal to or higher than that of Sample 1 (not containing the glass), while the water absorbance was maintained at a satisfactorily low level.

As shown in Sample 3, a porosity of 30 volume percent resulted in a high dielectric constant of 11.0 that was an unsatisfactory level. As shown in Sample 9, a porosity of 80 volume percent resulted in a low dielectric constant of 5.8 (less than 6). A porosity exceeding 80 volume percent, however, caused a decrease in mechanical strength of the ceramic sintered compact. Such low mechanical strength inhibited impregnation of the resin or glass.

For decreasing the dielectric constant, a composite formed by firing a mixture of glass and a ferrite raw material or a compound formed by kneading a resin with magnetic powder did not exhibit a high permeability even when the glass or resin content was the same as that in Table 1. More specifically, the permeability of the composite or compound was lower than that shown in Table 1.

For example, a composite formed by firing a mixture of a ferrite raw material and 50 volume percent glass had a low permeability $\mu$ of about 4 and a complex permeability $\mu''$ of almost zero at any frequency. When a compact is prepared by dispersing magnetic powder into glass or resin, the glass or resin covers the magnetic powder. The glass or resin probably segments the magnetic path from the magnetic material and thus decreases the permeability.

In contrast, the porous ceramic sintered compact of this embodiment has a high permeability because of maintaining of a permeability of the magnetic material itself. In this ceramic sintered compact, the magnetic path is probably not segmented.

(B) Preparation of Chip Coil Component (1) A silver paste for forming an electrode constituting an internal coil was applied to green ceramic sheets formed of a material of Sample 6 shown in Table 1 (the porosity of the sheets was 50 volume percent) by printing. The green ceramic sheets were stacked and compacted, and the green compact was cut into a chip. The chip was fired at 900° C. to burn the combustible material for the formation of pores. A ceramic sintered compact containing 50 volume percent pores and having a silver internal electrode was thereby obtained.

(2) The ceramic sintered compact was dipped into a Li—K liquid glass with a dielectric constant of 3.9 to impregnate the pores with the glass.

Figure 2:
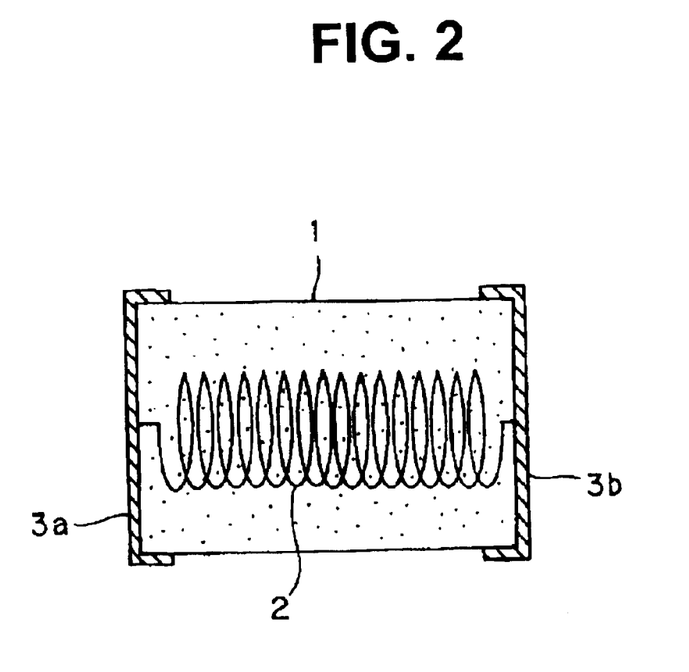
FIG. 2 is a cross-sectional view of a chip coil component in accordance with an embodiment of the present invention.

(3) A conductive paste for forming external electrodes was applied to both sides of the ceramic sintered compact, the sides being parallel to the coil axis so that the conductive paste was connected to the internal electrode. The ceramic sintered compact was heated at 800° C. to impregnate the pores with the glass and to fire the conductive paste. As shown in FIG. 2, a chip coil component with a length of 1.6 mm and a width and a height of 0.8 mm of the first embodiment was thereby prepared (EXAMPLE 1). A coil 2 with 30 turns was arranged inside the ceramic sintered compact 1, and external electrodes 3a, 3b were provided on both ends of the ceramic sintered compact 1.

For comparison, a chip coil component (COMPARATIVE EXAMPLE 1) was prepared using green ceramic sheets with a porosity of zero volume percent (Sample 1 in Table 1) composed of a general ferrite material as in EXAMPLE 1. The number of turns of the coil was 20 so that the inductance at a low-frequency region was nearly equal to that of EXAMPLE 1 for the sake of comparison of the characteristics.

Figure 3:
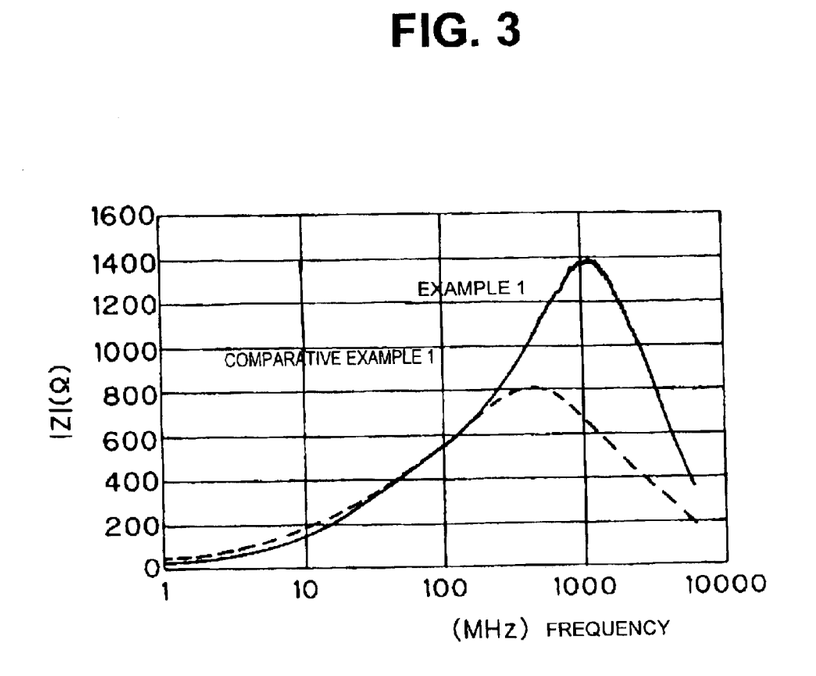
FIG. 3 is a graph of the dependence of impedance on frequency of chip coil components in accordance with EXAMPLE 1 and COMPARATIVE EXAMPLE 1.

The characteristics of the chip coil components of EXAMPLE 1 and COMPARATIVE EXAMPLE 1 were measured with a network analyzer HP8753D to calculate the impedance. FIG. 3 is a graph of impedance characteristics of the chip coil components of EXAMPLE 1 and COMPARATIVE EXAMPLE 1.

The chip coil component of EXAMPLE 1, composed of a magnetic porous ceramic sintered compact and exhibiting a decreased dielectric constant with a high permeability, exhibits an impedance that is comparable with that of the conventional component at a lower frequency region and exceeds that of the conventional component at a higher frequency region. That is, the chip coil component of COMPARATIVE EXAMPLE 1 has an impedance of at least 600 Ω at a frequency up to about 1.3 GHz, whereas the chip coil component of EXAMPLE 1 has an impedance of at least 600 Ω at a frequency up to about 4 GHz. Accordingly, the region having high impedance is expanded in EXAMPLE 1.

The chip coil component of EXAMPLE 1 contains glass packed in the pores of the ceramic sintered compact. Thus, this chip coil component exhibits a flexural strength that is comparable with that of the chip coil component of COMPARATIVE EXAMPLE 1 and a water absorbance that is lower than that of COMPARATIVE EXAMPLE 1. Accordingly, the chip coil component of the present invention favorably compares with that of COMPARATIVE EXAMPLE 1 in reliability.

Second Embodiment (A) Preparation of Porous Ceramic Sintered Compact (1) Porous ceramic sintered compacts having different porosities were prepared as in Step (5) in "(A) Preparation of porous ceramic sintered compact" in the first embodiment using compositions having different organic material contents.

(2) The pores of the ceramic sintered compacts were filled with an epoxy resin having a dielectric constant of 3.4 and the sintered compacts were heated to 150° C. to cure the epoxy resin.

The dielectric constant, the permeability, the flexural strength and the water absorbance of each resin-impregnated ceramic sintered compact were measured. The results are shown in Table 2.

(2) A conductive paste for forming external electrodes was applied to both sides of the ceramic sintered compact, the sides being parallel to the coil axis so that the conductive paste was connected to the internal electrode. The ceramic sintered compact was heated at 850° C. to fire the conductive paste for forming the external electrodes.

(3) This chip was impregnated with a liquid epoxy resin having a dielectric constant of 3.4 to impregnate the pores with the epoxy resin and to form a resin film on the surface of the ceramic sintered compact. The epoxy resin was cured at 150° C.

(4) The resin-impregnated sample was barrel-polished to expose the metal surfaces of the external electrodes completely, and the external electrodes were plated with nickel and then with tin to form plating layers on the metal surfaces.

A chip coil component with a length of 1.6 mm and a width and a height of 0.8 mm according to the second embodiment was thereby prepared (EXAMPLE 2). The number of turns of the coil was 30 in this embodiment.

For comparison, the chip coil component (COMPARATIVE EXAMPLE 1) used in the first embodiment was prepared. The number of turns of the coil was 20.

TABLE 2

| Sample | Average diameter of spherical polymer (μm) | Pore diameter (μm) | Porosity (%) | Pores filled with resin | | | | | | |
| --- | --- | --- | --- | --- | --- | --- | --- | --- | --- | --- |
| | | | | Dielectric constant at 1 MHz | Complex permability | | Water absorbance (%) | | Flexural strength (MPa) | |
| | | | | | At 1 MHz | At 1 GHz | Before resin impregnation | After resin impregnation | Before resin impregnation | After resin impregnation |
| 11 | 8 | 7 | 0 | 14.5 | 430 | 11 | 0.20 | — | 80 | — |
| 12 | 8 | 7 | 10 | 13.9 | 330 | 8.0 | 1.89 | 0.17 | 74 | 80 |
| 13 | 8 | 7 | 30 | 10.9 | 212 | 6.0 | 3.89 | 0.10 | 53 | 80 |
| 14 | 8 | 7 | 35 | 9.8 | 182 | 5.7 | 4.39 | 0.09 | 51 | 80 |
| 15 | 8 | 7 | 40 | 8.9 | 153 | 4.9 | 5.75 | 0.09 | 46 | 82 |
| 16 | 8 | 7 | 50 | 7.9 | 123 | 3.6 | 10.0 | 0.06 | 34 | 81 |
| 17 | 8 | 7 | 60 | 6.8 | 92 | 2.9 | 16.4 | 0.03 | 19 | 86 |
| 18 | 8 | 7 | 70 | 6.2 | 61 | 2.3 | 18.9 | 0.03 | 14 | 89 |
| 19 | 8 | 7 | 80 | 5.3 | 41 | 1.8 | 21.5 | 0.03 | 10 | 90 |

As shown in Table 2, the flexural strength of the ceramic sintered compact having the pores filled with the epoxy resin was equal to or higher than that of Sample 11 not containing the resin (Sample 11 being the same as Sample 1). The epoxy-impregnated sample having a porosity of 80% (Sample 19) favorably compares with an unimpregnated sample with a porosity of 30% in flexural strength. The epoxy-impregnated samples have lower water absorbance compared with the nonporous sample (Sample 11). The epoxy-impregnated samples with a porosity of 35 volume percent or more have a dielectric constant of 10 or less.

In comparison with glass, a resin having a lower dielectric constant may be available. The epoxy resin-impregnated samples in this embodiment have slightly lower dielectric constants than the glass-impregnated samples in the first embodiment.

(B) Preparation of Chip Coil Component (1) A silver paste for forming an electrode constituting an internal coil was applied to green ceramic sheets formed of a material of Sample 16 shown in Table 2 (the porosity of the sheets was 50 volume percent) by printing. The green ceramic sheets were stacked and compacted, and the green compact was cut into a chip. The chip was fired at 900° C. to burn the combustible material for the formation of pores. A ceramic sintered compact containing 50 volume percent pores and having a silver internal electrode was thereby obtained.

Figure 4:
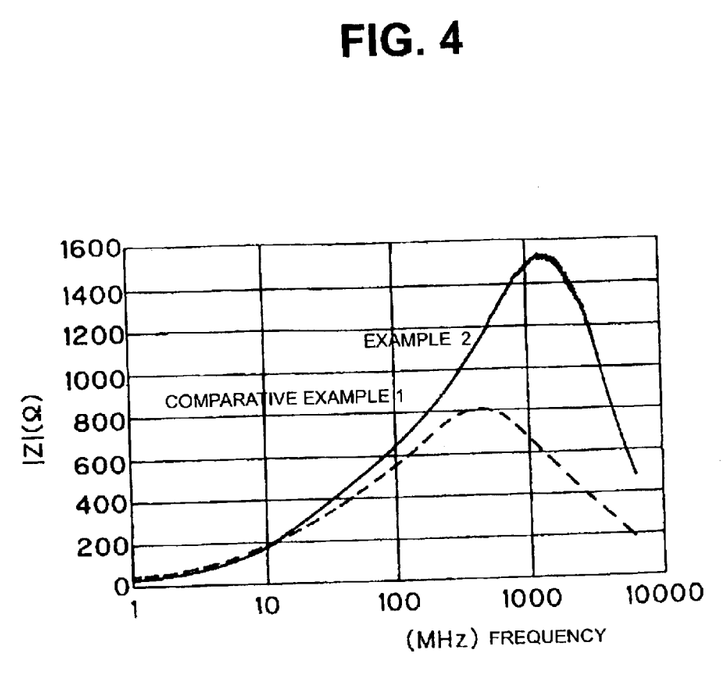
FIG. 4 is a graph of the dependence of impedance on frequency of chip coil components in accordance with EXAMPLE 2 and COMPARATIVE EXAMPLE 1.

The characteristics of the chip coil component of EXAMPLE 2 were measured with a network analyzer HP8753D to calculate the impedance. FIG. 4 is a graph of impedance characteristics of the chip coil components of EXAMPLE 2 and COMPARATIVE EXAMPLE 1.

The chip coil component of EXAMPLE 2, composed of a magnetic porous ceramic sintered compact and exhibiting a decreased dielectric constant with a high permeability, exhibits an impedance that is comparable with that of the conventional component at a lower frequency region and exceeds that of the conventional component at a higher frequency region. That is, the chip coil component of COMPARATIVE EXAMPLE 1 has an impedance of at least 600 Ω at a frequency up to about 1.3 GHz, whereas the chip coil component of EXAMPLE 2 has the impedance of at least 600 Ω at a frequency up to about 5 GHz. Accordingly, the region having high impedance is expanded in EXAMPLE 2.

The chip coil component of EXAMPLE 2 contains the epoxy resin packed in the pores of the ceramic sintered compact. Thus, this chip coil component exhibits a flexural strength that is comparable with that of the chip coil component of COMPARATIVE EXAMPLE 1 and a water absorbance that is lower than that of COMPARATIVE EXAMPLE 1. Accordingly, the chip coil component of the present invention favorably compares with that of COMPARATIVE EXAMPLE 1 in reliability.

Third Embodiment (1) Porous ferrite ceramic sintered compacts having a porosity of 60 volume percent were prepared as in the first or second embodiment.

(2) Each porous ferrite was dipped into an epoxy resin solution in an organic solvent with a viscosity of 300 mPa·s or 500 mPa·s and was heated at 150° C. for 30 minutes to cure the epoxy resin, wherein the dielectric constant of the epoxy resin was 3.4.

The porosity, the dielectric constant and the flexural strength of the resulting porous ferrite were measured.

Also, the porosity, the dielectric constant and the flexural strength of another porous ferrite were measured. This porous ferrite was prepared with a nonsolvent-type epoxy resin having a dielectric constant of 8.4 and a viscosity of 5,000 mPa·s, and the epoxy resin was cured. The results are shown in Table 3.

TABLE 3

| Filler | Porosity (volume %) | Dielectric constant | Flexural strength (MPa) |
|---|---|---|---|
| None | 60 | 6.6 | 20 |
| Epoxy resin (viscosity: 300 mPa·s) | 58 | 6.8 | 120 |
| Epoxy resin (viscosity: 500 mPa·s) | 57 | 6.9 | 131 |
| Epoxy resin (viscosity: 5,000 mPa·s) | 27 | 8.4 | 130 |

Table 3 shows that internal pores are formed in the epoxy resin packed in the original pores when an epoxy resin with a viscosity of 500 mPa·s or less is used. The resulting porous ferrite has high flexural strength and a low dielectric constant. These internal pores are formed by evaporation of the solvent or diluent contained in the epoxy resin packed in the original pores of the ferrite.

These internal pores may be formed by any other method. For example, the original pores of the ferrite are filled with a viscous resin or glass. Next, the porous ferrite is dipped into a solvent. Ultrasonic waves are applied to the ferrite through the solvent so that the impregnated resin or glass is partly removed. The solvent is removed by evaporation and the residual resin or glass is cured.

Fourth Embodiment

Figure 5:
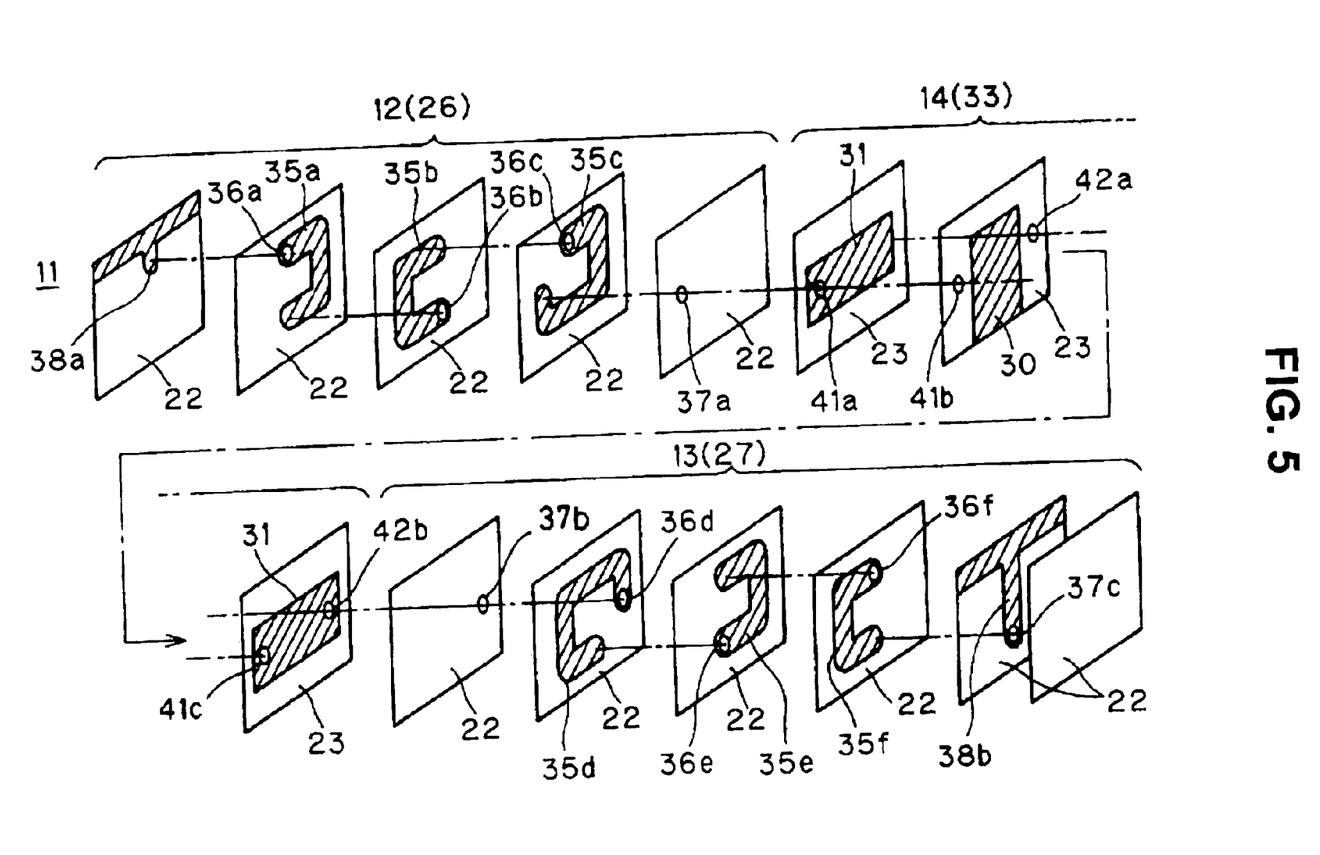
FIG. 5 is an exploded isometric view illustrating elements of a T-type LC filter in accordance with a fourth embodiment of the present invention.
Figure 6:
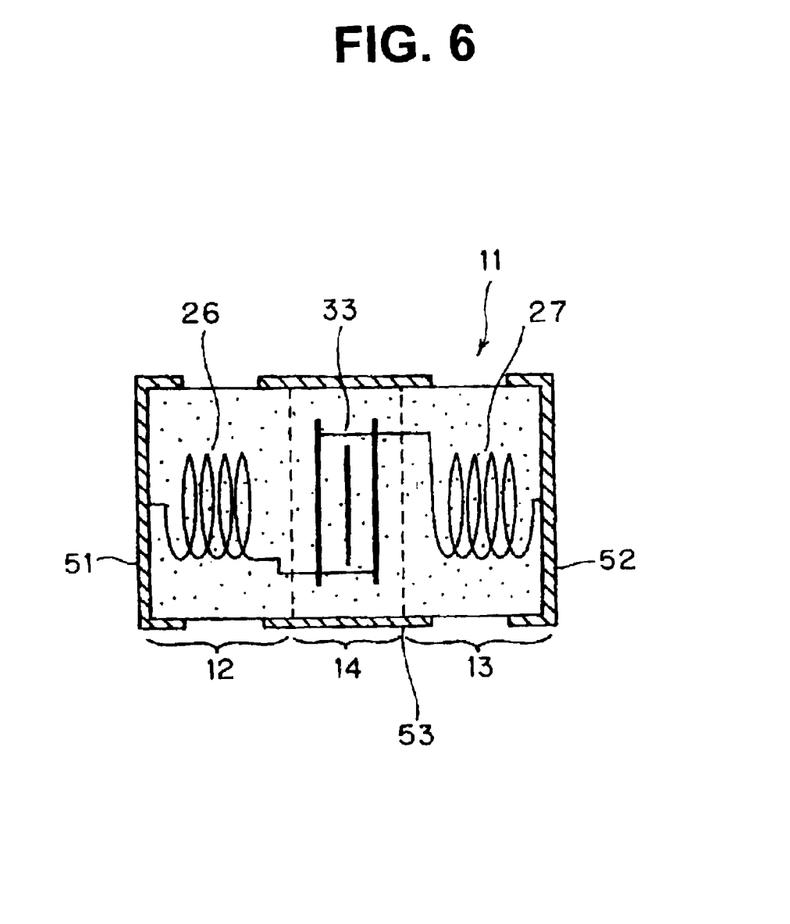
FIG. 6 is a schematic cross-sectional view of the T-type LC filter in accordance with the fourth embodiment of the present invention.

FIG. 5 is an exploded isometric view illustrating elements of a T-type LC filter that is an embodiment of the ceramic electronic component in accordance with the present invention; and FIG. 6 is a schematic cross-sectional view of this LC filter. Referring to FIG. 6, this ceramic electronic component 11 is a T-type or composite LC filter having a capacitor segment 14 disposed between two inductor segments (coil segments) 12 and 13.

Referring to FIG. 5, the inductor segment 12 is formed of a first magnetic layer 22 having a coil conductor 35a and a via hole 36a, a second magnetic layer 22 having a coil conductor 35b and a via hole 36b, a third magnetic layer 22 having a coil conductor 35c and a via hole 36c, a fourth magnetic layer 22 having an extraction via hole 37a, and a fifth magnetic layer 22 having an extraction conductor 38a. The coil conductors 35a to 35c are mutually connected through the via holes 36b and 36c to form a coil 26.

The inductor segment 13 is formed of a sixth magnetic layer 22 having a coil conductor 35d and a via hole 36d, a seventh magnetic layer 22 having a coil conductor 35e and a via hole 36e, an eighth magnetic layer 22 having a coil conductor 35f and a via hole 36f, a ninth magnetic layer 22 having an extraction via hole 37b, and a tenth magnetic layer 22 having an extraction conductor 38b and an extraction via hole second free ferromagnetic layer 37c. The coil conductors 35d to 35f are mutually connected through the via holes 36e and 36f to form a coil 27.

The capacitor segment 14 is formed of a first dielectric layer 23 having a through electrode 31 and a via hole 41a, a third dielectric layer 23 having a through electrode 31 and a via hole 41c and a via hole 42b for connecting the through electrodes 31, and a second dielectric layer 23 having a ground electrode 30 and a via hole 41b for connecting the through electrodes 31. The opposing ground electrodes 31 and the through electrode 31 constitute a capacitor 33.

These magnetic layers 22 and the dielectric layers are stacked and the stack is sintered. As shown in FIG. 6, an external input electrode 51 and an external output electrode 52 are disposed on both ends and external ground electrodes 53 are disposed in the central faces of the ceramic sintered compact.

In this T-type LC filter, the magnetic layers in the inductor segments 12 and 13 are composed of the porous ferrite material produced by the method in accordance with any one of the first to third embodiments. The capacitor segment is composed of a dielectric ceramic material.

Since the porous ferrite material of the magnetic layers in the inductor segments 12 and 13 has a low dielectric constant, the T-type LC filter has superior noise reduction characteristics at high frequencies.

Since this ferrite material is reinforced by the resin or glass packed in the pores, the T-type filter has high flexural strength and thus has enhanced reliability.

In the fourth embodiment, the T-type LC filter is described. The ferrite material of the present invention is also applicable to an LR composite electronic component including an inductor segment and a resistor segment and an LCR composite electronic component including an inductor segment, a capacitor segment and a resistor segment.

In the above embodiments, the combustible material is crosslinked polystyrene. Alternatively, the combustible material may be any other material that can be destructed by firing. The combustible material may be granular microparticles having any shape, in addition to spherical particles.

In the above embodiments, the ceramic sintered compact is composed of a Ni—Zn—Cu-based ferrite material. The present invention is also applicable to ceramic materials other than the ferrite material.

The present invention is not limited to the above embodiments. The type of the resin or glass packed in the pores of the ceramic sintered compact, the method for packing the resin or glass into the pores, and the firing condition for removing the combustible material may be modified within the scope of the present invention.

What is claimed is:

1. A ceramic electronic component comprising:
    a ceramic sintered compact containing about 35 to 80 volume percent of pores; and
    an electrode inside the ceramic sintered compact;
    wherein the pores are at least partly filled with resin or glass.

2. The ceramic electronic component according to claim 1, wherein the resin or glass in the pores contains internal pores.

3. The ceramic electronic component according to claim 2, wherein the internal pores have an average diameter in the range of about 5 μm to 20 μm.

4. The ceramic electronic component according to claim 1, wherein the ceramic sintered compact is a magnetic ceramic sintered compact.

5. The ceramic electronic component according to claim 1, wherein the ceramic electronic component comprises an inductor, an LC composite electronic component comprising an inductor segment and a capacitor segment, an LR composite electronic component comprising an inductor segment and a resistor segment, or an LCR composite electronic component comprising an inductor segment, a capacitor segment, and a resistor segment.

6. The ceramic electronic component according to claim 1, wherein the ceramic electronic component has a multilayer structure including an electrode layer between two adjacent ceramic layers.

7. The ceramic electronic component according to claim 1, wherein the pores have an average diameter in the range of about 5 μm to 20 μm.

8. The ceramic electronic component according to claim 7, wherein the pores have an average diameter in the range of about 5 μm to 10 μm and the pores are about 40 to 50 volume percent of the component.

9. The ceramic electronic component according to claim 7, wherein the ceramic sintered compact has at least one surface covered with the resin or glass.

10. The ceramic electronic component according to claim 1, wherein at least one surface of the ceramic sintered compact is covered with the resin or glass.

11. A method for making a ceramic electronic component including a ceramic sintered compact and an electrode inside the ceramic sintered compact, comprising:

(a) providing a green compact including an electrode therein with a ceramic compound comprising a ceramic raw material, a binder, and a spherical or granular combustible material having adhesiveness to the binder;

(b) firing the green compact to form a ceramic sintered compact including the electrode and containing about 35 to 80 volume percent pores; and (c) at least partly impregnating the pores of the ceramic sintered compact with resin or glass.

12. The method for making the ceramic electronic component according to claim 11, wherein the combustible material comprises at least one compound selected from the group consisting of crosslinked polystyrene, crosslinked polymethyl methacrylate, crosslinked polybutyl methacrylate, crosslinked polymethacrylate esters, and crosslinked polyacrylate esters.

13. The method for making the ceramic electronic component according to claim 11, wherein the resin or glass employed to fill the pores of the ceramic sintered compact contains a solvent or a diluent, and the method further comprises evaporating the solvent or diluent to form internal pores in the resin or glass.

14. The method for making the ceramic electronic component according to claim 11, wherein the resin or glass employed to fill the pores of the ceramic sintered compact is partly soluble in a solvent, and the method further comprises partly dissolving the resin or glass with the solvent to form internal pores in the resin or glass.

15. The method for making the ceramic electronic component according to claim 11, wherein the ceramic raw material is a magnetic ceramic raw material.

16. The method for making the ceramic electronic component according to claim 11, further comprising employing the ceramic electronic component to form an inductor, an LC composite electronic component comprising an inductor segment and a capacitor segment, an LR composite electronic component comprising an inductor segment and a resistor segment, or an LCR composite electronic component comprising an inductor segment, a capacitor segment and a resistor segment.

17. The method for making the ceramic electronic component according to claim 11, further comprising forming the green compact by providing an electrode layer on each of a plurality of green ceramic sheets comprising the ceramic compound, and stacking the plurality of green ceramic sheets having the electrode layer.

18. The method for making the ceramic electronic component according to claim 11, wherein the combustible material comprises about 35 to 80 volume percent of the green compact and has an average diameter in the range of about 5 μm to 20 μm.

19. The method for making the ceramic electronic component according to claim 18, further comprising providing a surface of the at least partly impregnated ceramic sintered compact with a layer of resin or glass.

20. The method for making the ceramic electronic component according to claim 18, wherein the combustible material has an average diameter in the range of about 5 μm to 10 μm and is about 40 to 50 volume percent of the green compact.

* * * * *